United States Patent
Jung et al.

[11] Patent Number: 5,852,572
[45] Date of Patent: Dec. 22, 1998

[54] SMALL-SIZED STATIC RANDOM ACCESS MEMORY CELL

[75] Inventors: Soon-moon Jung, Seongnam; Yun-seung Shin, Seoul, both of Rep. of Korea

[73] Assignee: Samsung Electronics, Co., Ltd., Suwon, Rep. of Korea

[21] Appl. No.: 906,270

[22] Filed: Aug. 5, 1997

[30] Foreign Application Priority Data

Dec. 4, 1996 [KR] Rep. of Korea ................ 1996-61659

[51] Int. Cl.$^6$ ................................................ G11C 11/34
[52] U.S. Cl. ........................................ 365/154; 365/156
[58] Field of Search ................................. 365/154, 156, 365/189.09, 189.11, 190

[56] References Cited

U.S. PATENT DOCUMENTS

| | | | |
|---|---|---|---|
| 4,653,025 | 3/1987 | Minato et al. | 365/154 |
| 5,521,861 | 5/1996 | Lee et al. | 365/156 |
| 5,570,312 | 10/1996 | Fu | 365/154 |
| 5,600,589 | 2/1997 | Ishigaki | 365/154 |

*Primary Examiner*—Son Mai
*Attorney, Agent, or Firm*—Marger, Johnson, & McCollom, P.C.

[57] ABSTRACT

A SRAM cell includes a single line used as both a word line and a power supply voltage line, a first and a second load element, a first and a second NMOS driver transistor, and a first and a second PMOS access transistor. Each of the two load elements is connected between the line and one of two storage nodes. The first load element is connected between the single line and a first storage node. The second load element is connected between the single line and a second storage node. The first NMOS driver transistor is connected between the first storage node and ground. The second driver transistor is connected between the second storage node and ground. The first access transistor is connected between the first storage node and a bit line and the second access transistor is connected between the second storage node and a complementary bit line. The first and second access transistors have gates commonly connected to the single line. The layout of the SRAM cell is simplified and the cell layout area is reduced because a single line is used as both the power supply voltage line and the word line.

21 Claims, 3 Drawing Sheets

SMALL-SIZED STATIC RANDOM ACCESS MEMORY CELL

BACKGROUND OF THE INVENTION

1. Field of the Invention

The present invention relates to a memory cell of a semiconductor memory device, and more particularly, to the cell of a Static Random Access Memory (SRAM) device.

2. Description of the Related Art

As semiconductor memory devices become more highly integrated, it becomes important to decrease the area of a unit memory cell in order to reduce the overall device layout area. Additionally, semiconductor memory devices having low voltage and low stand-by current operating requirements are desirable to satisfy the high demand for battery operated semiconductor memory devices. Accordingly, research into low voltage and low standby current operating requirements for memory devices has expanded, in particular, research into SRAM devices having a reduced layout area has increased.

A conventional SRAM cell will be explained briefly with reference to FIGS. 1 and 2. FIG. 1 is a circuit diagram of the conventional SRAM cell. Referring to FIG. 1, the conventional SRAM cell has load elements L1 and L2 connected between a power supply voltage VCC and storage nodes N1 and N2, respectively. The SRAM cell also includes NMOS driver transistors ND1 and ND2 connected between the storage nodes N1 and N2, respectively, and ground VSS. The NMOS access transistors NT1 and NT2 are connected between the storage nodes N1 and N2, respectively, and a bit line BL and a complementary bit line BLB, respectively. The gates of the NMOS drive transistors ND1 and ND2 are cross-coupled and connected to the storage nodes N2 and N1, respectively. The word line WL is connected to the gates of the NMOS access transistors NT1 and NT2.

In the 1970s, NMOS depletion transistors were used as the load elements L1 and L2. Such an SRAM cell is called an NMOS depletion load cell. The NMOS depletion load cell requires high standby-current consumption and has a limited cell size reduction capability. Therefore, in order to replace the NMOS depletion load cell, a high-resistivity poly load cell formed using polysilicon has been developed for use as the load elements L1 and L2. However, the poly load cell is limited to use as a SRAM having a 4 Mbit capacity or larger, low standby current, and low voltage operation capability. In the late 1980s, a thin film transistor (TFT) load cell using TFTs as the load elements was developed to be adopted for a 4 Mbit low-speed SRAM. The TFT load cell has low standby current consumption and an improved soft error rate. The soft error rate refers to the rate at which data inversion occurs because of electrons from electron-hole pairs generated by α-particle irradiation collected in a storage node having high data. However, the TFT load cell requires complex manufacturing processes and has a limited low voltage operation capability.

Also, a "high" level voltage is applied to the word line WL to activate the access transistors NT1 and NT2 in the conventional SRAM cell using the NMOS access transistor shown in FIG. 1. Therefore, when "high" level data is intended to be written from the bit line BL or complementary bit line BLB to the storage node N1 or N2, a voltage drop corresponding to a threshold voltage occurs in the NMOS access transistors NT1 and NT2.

FIG. 2 is a circuit diagram of another conventional SRAM cell which is developed for preventing the threshold voltage drop in the NMOS access transistors NT1 and NT2 shown in FIG. 1. Here, like symbols are used for designating like or equivalent portions shown in FIG. 1.

Referring to FIG. 2, the conventional SRAM cell has load elements L1 and L2 connected between a power supply voltage VCC and storage nodes N1 and N2, respectively. The SRAM cell additionally includes NMOS driver transistors ND1 and ND2 connected between the storage nodes N1 and N2, respectively, and ground VSS, in like manner to the SRAM cell shown in FIG. 1. Furthermore, the conventional SRAM cell shown in FIG. 2 has PMOS access transistors PT1 and PT2 connected between the storage nodes N1 and N2, respectively, and the bit line BL and the complementary bit line BLB, respectively. Unlike the SRAM cell shown in FIG. 1, the SRAM cell shown in FIG. 2 replaces NMOS access transistors NT1 and NT2 with PMOS access transistors PT1 and PT2, respectively.

In the SRAM cell shown in FIG. 2, when "high" level data is written from the bit line BL or complementary bit line BLB to the storage node N1 or N2, a "low" level voltage is applied to the word line WL to activate the PMOS access transistors PT1 and PT2. Therefore, the "high" level data from the bit line BL or the complementary bit line BLB can be transferred without a voltage drop in the PMOS access transistors PT1 and PT2.

However, in the conventional SRAM cell shown in FIG. 2, since the word line WL and the power supply voltage VCC line are separately formed during the layout stage, they may become tangled with local interconnection lines which makes optimum layout difficult. Thus, the cell layout area increases.

Accordingly, a need remains for a SRAM memory cell with reduced layout area and low voltage and stand-by current operating requirements.

SUMMARY OF THE INVENTION

It is an object of the present invention to provide a SRAM cell which overcomes the deficiencies of prior art SRAM cells.

It is another object of the present invention to provide a SRAM cell having a reduced layout area.

It is yet another object of the present invention to provide a SRAM cell having low voltage and stand-by current operating requirements.

To accomplish the above objects of the present invention, there is provided a static random access memory (SRAM) cell comprising a single line used for receiving both a word and power supply voltage, a first and second load element, a first and second NMOS driver transistor, and a first and second PMOS access transistor. The first load element is connected between the single line and a first storage node. The second load element is connected between the single line and a second storage node. The first NMOS driver transistor is connected between the first storage node and ground. The second driver transistor is connected between the second storage node and ground. The first access transistor is connected between the first storage node and a bit line and the second access transistor is connected between the second storage node and a complementary bit line. The first and second access transistors have gates commonly connected to the single line. The first and second load elements are high-resistivity resistors formed of polysilicon, NMOS transistors, PMOS transistors, or TFTs.

According to another aspect of the present invention, there is provided an SRAM cell comprising a dual-use line for receiving both a word and a power supply voltage, a first and a second load element, a first and a second NMOS driver transistor, a first and a second PMOS access transistor, and a first and a second current distributing element. The first load element is connected between the single line and a first storage node. The second load element is connected between the single line and a second storage node. The first NMOS driver transistor is connected between the first storage node and ground. The second driver transistor is connected between the second storage node and ground. The first access transistor is connected between the first storage node and a bit line and the second access transistor is connected between the second storage node and a complementary bit line. The first and second access transistors have gates commonly connected to the single line. The first current distributing element is connected between the bit line and the power supply voltage for distributing current to the bit line. The second current distributing element is connected between the complementary bit line and the power supply voltage for distributing current to the complementary bit line. The first and second load elements are high-resistivity resistors formed of polysilicon, NMOS transistors, PMOS transistors, or TFTs. The first and second current distributing elements are PMOS or NMOS transistors.

According to still another aspect of the present invention, there is provided an SRAM cell comprising a line used as both a word line and a power supply voltage line, a first and a second load element, a first and a second diode, a first and a second NMOS driver transistor, and a first and a second PMOS access transistors. The first load element is connected between the single line and a first storage node. The second load element is connected between the single line and a second storage node. The first NMOS driver transistor is connected between the first storage node and ground. The second driver transistor is connected between the second storage node and ground. The first access transistor is connected between the first storage node and a bit line and the second access transistor is connected between the second storage node and a complementary bit line. The first and second access transistors have gates commonly connected to the single line. The first diode is connected between the first load element and the first storage node. The second diode is connected between the second load element and the second storage node. Also, the anode of the first and second diodes is connected to the first terminal of the first and second load elements, respectively, and the cathode of the first and second diodes is connected to the first and second storage nodes, respectively.

Therefore, in the SRAM cell according to the present invention, since a single line is used as both the power supply voltage line and the word line, the cell layout is facilitated and the cell layout area is reduced.

BRIEF DESCRIPTION OF THE DRAWINGS

The above objects and advantages of the present invention will become more readily apparent by describing in detail a preferred embodiment thereof with reference to the attached drawings in which.

DETAILED DESCRIPTION OF THE INVENTION

In FIGS. 1–5, like symbols designate like or equivalent portions.

Figure 1:
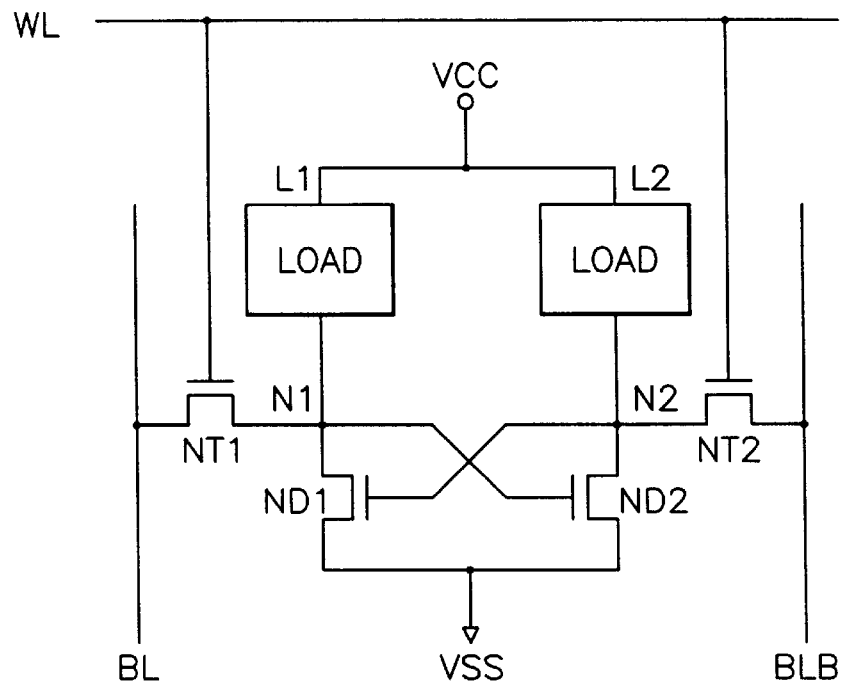
FIG. 1 is a circuit diagram of a conventional SRAM cell.
Figure 2:
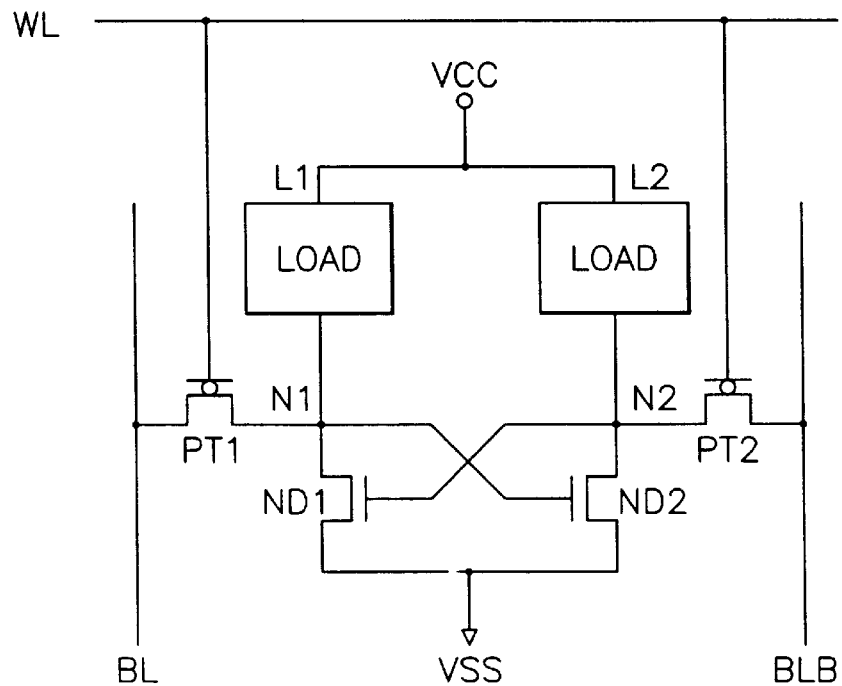
FIG. 2 is a circuit diagram of another conventional SRAM cell.
Figure 3:
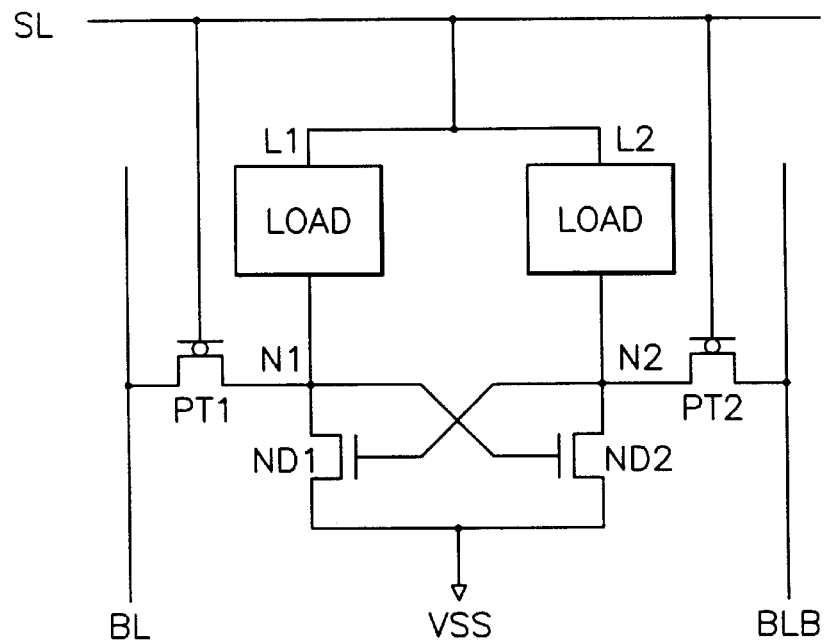
FIG. 3 is a circuit diagram of an SRAM cell according to a first embodiment of the present invention.

Referring to FIG. 3, the SRAM cell according to a first embodiment of the present invention, like the conventional SRAM cell shown in FIG. 2, includes NMOS driver transistors ND1 and ND2 connected between storage nodes N1 and N2, respectively, and ground VSS. The SRAM cell shown in FIG. 3 also includes PMOS access transistors PT1 and PT2 connected between the storage nodes N1 and N2, respectively, and a bit line BL and a complementary bit line BLB, respectively.

However, in the SRAM cell according to the first embodiment of the present invention, a single, dual-use, line SL is used as both a word line WL and a power supply voltage VCC line. In other words, the single line SL receives both a word and the power supply voltage. Load elements L1 and L2 are connected between the single line SL and storage nodes N1 and N2, respectively. The gates of the PMOS access transistors PT1 and PT2 are connected to the single line SL. The load elements L1 and L2 are, for example, a resistor having a high-resistivity formed of polysilicon, an NMOS transistor, a PMOS transistor, or a TFT.

If a PMOS transistor is used as the access transistor PT1 or PT2, during a standby period, a "high" level voltage is applied to a word line which is connected to gates of the access transistors PT1 and PT2. Therefore, a single line SL can be used for both a power supply voltage line for supplying a power supply voltage VCC and a word line WL. In other words, during a standby period, a "high" level voltage is supplied through the single line SL to the gates of the PMOS access transistors PT1 and PT2 so that the PMOS access transistors PT1 and PT2 are turned off and a "high" level voltage having the same level as the power supply voltage VCC is applied to the load element L1 and L2.

Moreover, when data is written into the SRAM cell, a "low" level voltage is supplied through the line SL to the gates of the PMOS transistors PT1 and PT2 so that the PMOS access transistors PT1 and PT2 are turned on. The "low" level voltage is also applied to the load elements L1 and L2. Accordingly, "high" level data is transferred from the bit line BL or complementary bit line BLB to the storage nodes N1 or N2, respectively, through the PMOS access transistor PT1 or PT2. At this time, current flows through the load element L1 or L2 from the storage node having "high" level data to the single line SL having a "low" level voltage which causes a voltage drop in the storage node having "high" level data. This voltage drop can be prevented, to some degree by increasing the capacitance of the storage nodes N1 and N2.

Therefore, in the SRAM cell according to the present invention shown in FIG. 3, since a single line SL is compatible for use as both the power supply voltage VCC line and word line WL, the layout of the cell is simplified and the cell layout area is reduced.

Figure 4:
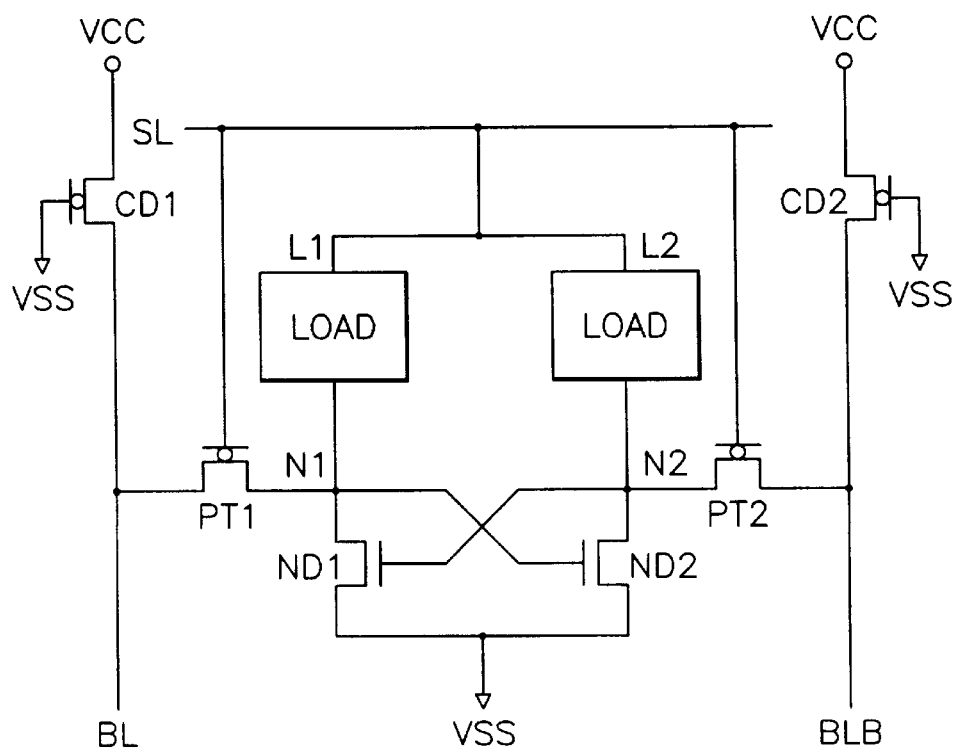
FIG. 4 is a circuit diagram of an SRAM cell according to a second embodiment of the present invention.

FIG. 4 is a circuit diagram of a SRAM cell according to a second embodiment of the present invention. Referring to FIG. 4, NMOS driver transistors ND1 and ND2 are connected between storage nodes N1 and N2, respectively, and ground VSS. The SRAM cell also includes PMOS access transistors PT1 and PT2 connected between the storage nodes N1 and N2, respectively, and a bit line BL and a complementary bit line BLB, respectively. Also, a single line SL is used as both a word line WL and a power supply voltage VCC line. Load elements L1 and L2 are connected between the single line SL and the storage nodes N1 and N2, respectively. The gates of the PMOS access transistors PT1 and PT2 are connected to the single line SL. The load elements L1 and L2 are, for example, a resistor having high-resistivity formed of polysilicon, an NMOS transistor, a PMOS transistor, or a TFT.

However, in the SRAM cell according to the second embodiment of the present invention, in order to distribute current to the bit line BL and complementary bit line BLB, current distributing elements CD1 and CD2 are connected between the bit line BL and complementary bit line BLB and the power supply voltage VCC, respectively. The current distributing elements CD1 and CD2 are preferable either PMOS transistors or NMOS transistors. The current distributing elements CD1 and CD2 shown in FIG. 4 are PMOS transistors.

The current distributing elements CD1 and CD2 are used to compensate for the voltage drop in the storage node having "high" level data due to insufficient storage node capacitance in the first embodiment of FIG. 3. In other words, when current flows from the storage node having "high" level data to the line SL having a "low" level voltage, the current distributing elements CD1 and CD2 distribute sufficient additional current to the storage nodes N1 and N2 through the bit line BL and complementary bit line BLB, respectively, thereby compensating for the current flowing toward the single line SL. Therefore, the voltage drop in the storage node having "high" level data is prevented.

Figure 5:
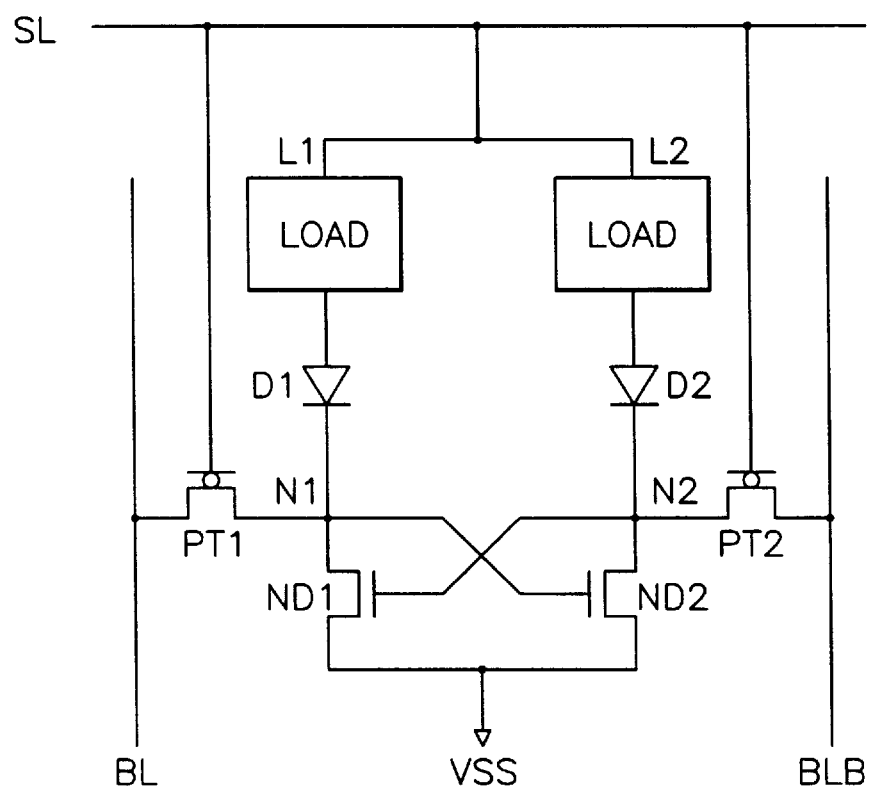
FIG. 5 is a circuit diagram of an SRAM cell according to a third embodiment of the present invention.

FIG. 5 is a circuit diagram of an SRAM cell according to a third embodiment of the present invention.

Referring to FIG. 5, NMOS driver transistors ND1 and ND2 are connected between storage nodes N1 and N2, respectively, and ground VSS. The SRAM cell also includes PMOS access transistors PT1 and PT2 connected between the storage nodes N1 and N2, respectively, and a bit line BL and a complementary bit line BLB, respectively. Also, a single line SL is used as both a word line WL and a power supply voltage VCC line. Load elements L1 and L2 are connected between the single line SL and storage nodes N1 and N2, respectively. The gates of the PMOS access transistors PT1 and PT2 are connected to the single line SL. The load elements L1 and L2 are, for example, a resistor having high-resistivity formed of polysilicon, an NMOS transistor, a PMOS transistor, or a TFT.

However, in the SRAM cell according to the third embodiment of the present invention, one terminal of each load element L1 and L2 is connected to the single line SL, and diodes D1 and D2 are respectively connected between the other terminal of the load elements L1 and L2 and the storage nodes N1 and N2. Here, the anodes of the diodes D1 and D2 are connected to the terminals of the load elements L1 and L2, respectively, and the cathodes of the diodes D1 and D2 are connected to the storage nodes N1 and N2, respectively. The diodes D1 and D2 prevent the current from flowing from the storage node having the "high" level data to the single line SL having a "low" level voltage. In other words, since the diodes D1 and D2 are back-biased, the flow of current into the single line SL is prevented.

Therefore, in the SRAM cell according to the third embodiment of the present invention, the cell area is somewhat increased because the diodes D1 and D2 are included. However, since only a single line SL compatible for both the power supply voltage VCC line and word line WL is used, the layout of the cell is simple and the cell layout area is reduced. Furthermore, stable cell characteristics are maintained due to the diodes D1 and D2.

Having illustrated an described the principles of the invention in a preferred embodiment thereof, it should be readily apparent to those skilled in the art that the invention can be modified in arrangement and detail without departing from such principles. We claim all modifications coming within the spirit and scope of the present invention.

What is claimed is:

1. A static random access memory (SRAM) cell, comprising:
   a single line for receiving both a word and a power supply voltage;
   a first load element connected between the single line and a first storage node;
   a second load element connected between the single line and a second storage node;
   a first NMOS driver transistor connected between the first storage node and ground;
   a second NMOS driver transistor connected between the second storage node and ground;
   a first PMOS access transistor connected between the first storage node and a bit line, the first PMOS transistor having a gate connected to the single line; and
   a second PMOS access transistor connected between the second storage node and a complementary bit line, the second PMOS transistor having a gate connected to the single line.

2. The SRAM cell of claim 1 wherein the first and second load elements are resistors having a high resistivity.

3. The SRAM cell of claim 2 wherein the resistors are formed of polysilicon.

4. The SRAM cell of claim 1 wherein the first and second load elements are NMOS transistors.

5. The SRAM cell of claim 1 wherein the first and second load elements are PMOS transistors.

6. The SRAM cell of claim 1 wherein the first and second load elements are thin film transistors (TFTs).

7. An SRAM cell, comprising:
   a dual-use line for receiving a word and a power supply voltage;
   a first load element connected between the dual-use line and a first storage node;
   a second load element connected between the dual-use line and a second storage node;
   a first NMOS driver transistor connected between the first storage node and ground;
   a second NMOS driver transistor connected between the second storage node and ground;
   a first PMOS access transistor connected between the first storage node and a bit line, the first PMOS access transistor having a gate connected to the dual-use line;
   a second PMOS access transistor connected between the second storage node and a complementary bit line, the second PMOS access transistor having a gate connected to the dual-use line;
   a first current distributing element connected between the bit line and the power supply voltage for distributing current to the bit line; and
   a second current distributing element connected between the complementary bit line and the power supply voltage for distributing current to the complementary bit line.

8. The SRAM cell of claim 7 wherein the first and second load elements are resistors having a high resistivity.

9. The SRAM cell of claim 8 wherein the resistors are formed of polysilicon.

10. The SRAM cell of claim 7 wherein the first and second load elements are NMOS transistors.

11. The SRAM cell of claim 7 wherein the first and second load elements are PMOS transistors.

12. The SRAM cell of claim 7 wherein the first and second load elements are thin film transistors.

13. The SRAM cell of claim 7 wherein the first and second current distributing elements are PMOS transistors.

14. The SRAM cell of claim 7 wherein the first and second current distributing elements are NMOS transistors.

15. An SRAM cell comprising:
- a line used as both a word line and a power supply voltage line;
- a first load element having a first and a second terminal, the first terminal being connected to the line;
- a second load element having a first and a second terminal, the first terminal being connected to the line;
- a first diode connected between the second terminal of the first load element and a first storage node;
- a second diode connected between the second terminal of the second load element and a second storage node;
- a first NMOS driver transistor connected between the first storage node and ground;
- a second NMOS driver transistor connected between the second storage node and ground;
- a first PMOS access transistor connected between the first storage node and a bit line, the first PMOS access transistor having a gate connected to the line;
- a second PMOS access transistor connected between the second storage node and a complementary bit line, the second PMOS access transistor having a gate connected to the line.

16. The SRAM cell of claim 15 wherein the first and second load elements are resistors having a high resistivity.

17. The SRAM cell of claim 16 wherein the resistors are formed of polysilicon.

18. The SRAM cell of claim 15 wherein the first and second load elements are NMOS transistors.

19. The SRAM cell of claim 15 wherein the first and second load elements are PMOS transistors.

20. The SRAM cell of claim 15 wherein the first and second load elements are thin film transistors (TFTs).

21. The SRAM cell of claim 15 wherein the first diode includes an anode and a cathode, the anode of the first diode is connected to the second terminal of the first load element and the cathode of the first diode is connected to the first storage node and wherein the second diode includes an anode and a cathode, the anode of the second diode is connected to the second terminal of the second load element and the cathode of the second diode is connected to the second storage node.

* * * * *